United States Patent
Hiyama et al.

(10) Patent No.: US 8,421,889 B2
(45) Date of Patent: Apr. 16, 2013

(54) IMAGE PICKUP APPARATUS, IMAGE PICKUP SYSTEM, AND METHOD OF THE IMAGE PICKUP APPARATUS HAVING PIXEL ARRAY FOR OUTPUTTING AN ANALOG SIGNAL

(75) Inventors: Hiroki Hiyama, Zama (JP); Masaaki Iwane, Sagamihara (JP); Kazuo Yamazaki, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 560 days.

(21) Appl. No.: 12/607,820

(22) Filed: Oct. 28, 2009

(65) Prior Publication Data
US 2010/0110257 A1 May 6, 2010

(30) Foreign Application Priority Data
Oct. 31, 2008 (JP) ................................ 2008-281867

(51) Int. Cl.
*H04N 5/335* (2006.01)
*H01L 27/146* (2006.01)

(52) U.S. Cl.
USPC ........... 348/272; 348/273; 348/294; 348/308; 250/208.1

(58) Field of Classification Search ........... 348/294–324
See application file for complete search history.

(56) References Cited

U.S. PATENT DOCUMENTS

| | | | |
|---|---|---|---|
| 2005/0168602 A1* | 8/2005 | Sumi et al. | 348/294 |
| 2005/0270282 A1 | 12/2005 | Kawaguchi | |
| 2006/0219866 A1* | 10/2006 | Egawa et al. | 250/208.1 |
| 2007/0046795 A1* | 3/2007 | Yamashita | 348/294 |
| 2007/0139544 A1* | 6/2007 | Egawa et al. | 348/308 |
| 2008/0111905 A1* | 5/2008 | Toyama et al. | 348/308 |
| 2008/0117321 A1* | 5/2008 | Muramatsu | 348/308 |
| 2008/0284626 A1 | 11/2008 | Hattori | |
| 2009/0009372 A1* | 1/2009 | Yamashita | 341/122 |

FOREIGN PATENT DOCUMENTS

| | | | |
|---|---|---|---|
| JP | 2002-232291 A | | 8/2002 |
| JP | 2002232291 A | * | 8/2002 |
| JP | 2005-311487 A | | 11/2005 |
| JP | 2005-348324 A | | 12/2005 |

* cited by examiner

*Primary Examiner* — Chieh M Fan
*Assistant Examiner* — Dwight C Tejano
(74) *Attorney, Agent, or Firm* — Canon U.S.A., Inc. IP Division (57) ABSTRACT

An apparatus includes a pixel array in which pixels for outputting an analog signal are arranged in a matrix, vertical output lines each of which is connected to pixels in a same column, A/D conversion units, which are individually connected to the vertical output lines, for converting the analog signal into a digital signal, and a constant current supply unit for supplying a constant current to the A/D conversion units. Each of the A/D conversion units includes an integration unit for integrating the constant current, a comparison unit for comparing the integrated constant current with the analog signal and outputting a comparison signal, and a digital signal storage unit for storing a digital signal corresponding to the comparison signal. The integration unit includes an input capacitor for receiving the constant current. The comparison unit is connected to the constant current supply unit via the input capacitor.

9 Claims, 11 Drawing Sheets

IMAGE PICKUP APPARATUS, IMAGE PICKUP SYSTEM, AND METHOD OF THE IMAGE PICKUP APPARATUS HAVING PIXEL ARRAY FOR OUTPUTTING AN ANALOG SIGNAL

BACKGROUND OF THE INVENTION

1. Field of the Invention

The present invention relates to solid-state image pickup apparatuses used in scanners, digital still cameras, digital camcorders, etc.

2. Description of the Related Art

In recent years, CMOS image sensors have been widely used in digital still cameras, digital camcorders, and camera units included in mobile telephones. A technique for integrating A/D conversion circuits into a CMOS image sensor has been developed so as to reduce the number of components and power consumption. Various types of CMOS image sensors including A/D conversion circuits have been proposed, and include a CMOS image sensor with an A/D conversion circuit provided for each column of pixels called column A/D conversion circuits.

Such an A/D conversion circuit compares an analog signal with a reference signal. Japanese Patent Laid-Open No. 2005-348324 discloses a technique for applying a voltage having a fixed value to A/D conversion circuits as a reference signal. In this case, since a constant current passes through both ends of a resistance element included in each of A/D conversion circuits that are individually provided for columns, it is possible to more easily enhance speed as compared with a case in which a reference voltage is changed with time.

Figure 10:
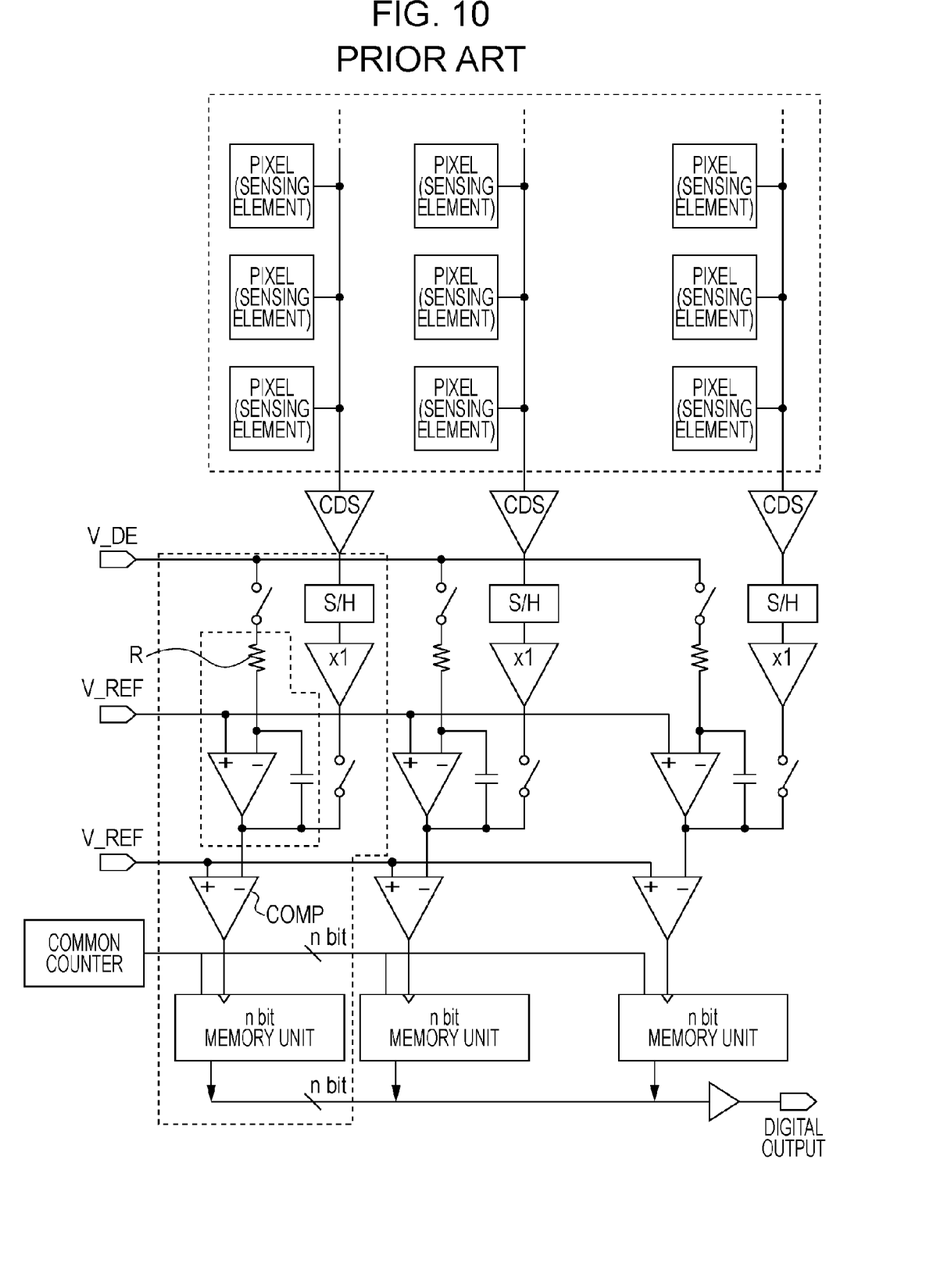
FIG. 10 is a diagram cited from FIG. 1 of Japanese Patent Laid-Open No. 2005-348324.

FIG. 10 is a schematic diagram illustrating a configuration of a solid-state image pickup apparatus in the related art, and cites FIG. 1 of Japanese Patent Laid-Open No. 2005-348324. For explanation, reference numerals different from those used in Japanese Patent Laid-Open No. 2005-348324 are used.

A reference voltage V_DE having a fixed value is input into A/D conversion circuits that are individually provided for columns. When these A/D conversion circuits start a conversion operation, a constant current passes through both ends of a resistor R included in each of the A/D conversion circuits. However, since a line CL for supplying a reference voltage having a fixed value has a resistance value, a potential gradient occurs in the line CL. That is, since a voltage across both ends of the resistor R differs from column to column, a current passing through both ends of the resistor R differs from column to column.

Even if integration operations are individually started in columns at the same time and the values of analog signals to be converted into digital signals in the columns are the same, a period of time used for inversion of the outputs of a comparator COMP may differ from column to column because the value of a current passing through the A/D conversion circuit differs from column to column. Accordingly, shading occurs in a direction along a single row from which signals that have been converted at the same time are output. If the number of columns of pixels in a solid-state image pickup apparatus and the length of a line for supplying a reference voltage are increased, this phenomenon becomes more pronounced.

SUMMARY OF THE INVENTION

An apparatus includes: a pixel array in which a plurality of pixels for outputting an analog signal are arranged in a matrix; a plurality of vertical output lines each of which is connected to corresponding ones of the plurality of pixels in a same column of the pixel array; a plurality of A/D conversion units, which are individually connected to the plurality of vertical output lines, configured to convert the analog signal into a digital signal; and a constant current supply unit configured to supply a constant current to the plurality of A/D conversion units. Each of the plurality of A/D conversion units includes an integration unit configured to integrate the constant current, a comparison unit configured to compare the integrated constant current with the analog signal and output a comparison signal, and a digital signal storage unit configured to store a digital signal corresponding to the comparison signal. The integration unit includes an input capacitor configured to receive the constant current from one terminal thereof. The comparison unit is connected to the constant current supply unit via the input capacitor.

Further features of the present invention will become apparent from the following description of exemplary embodiments with reference to the attached drawings.

DESCRIPTION OF THE EMBODIMENTS

The first embodiment of the present invention will be described with reference to the accompanying drawings.

Figure 1A:
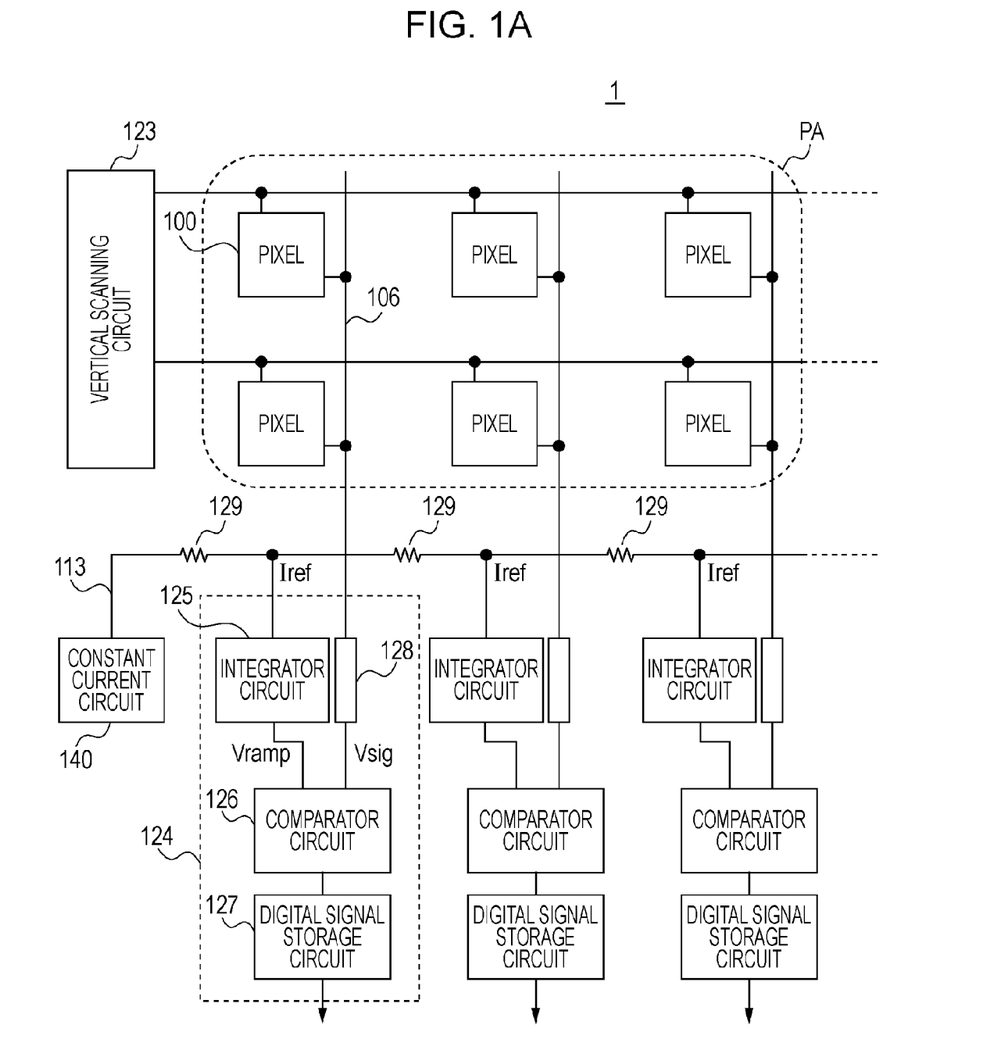
FIGS. 1A and 1B are schematic diagrams of a solid-state image pickup apparatus according to a first embodiment of the present invention.

FIG. 1A is a schematic block diagram of a solid-state image pickup apparatus 1 according to the first embodiment of the present invention. The solid-state image pickup apparatus 1 has a pixel array PA in which pixels 100 are arranged in a matrix. Referring to FIG. 1A, the pixels 100 arranged in the same column are connected to a vertical output line 106. A vertical scanning circuit 123 supplies a common control signal to the pixels 100 arranged in the same row. In response to the control signal supplied from the vertical scanning circuit 123, the pixels 100 individually output analog signals to the vertical output lines 106.

Each of the vertical output lines 106 is connected to a first input terminal of an A/D conversion circuit 124 that is an A/D conversion unit. An analog signal processing circuit 128 for performing processing such as noise reduction and amplification upon an analog signal output from the pixel 100 to the vertical output line 106 is connected to the first terminal of the A/D conversion circuit 124. The analog signal processing circuit 128 may be a circuit with its input terminal and output terminal short-circuited. An output terminal of the analog signal processing circuit 128 is connected to one input terminal of a comparator circuit 126 that is a comparison unit. A second input terminal of each of the A/D conversion circuits 124 is connected to a constant current circuit 140 that is a constant current supply unit via a reference signal supply line 113. Furthermore, the second input terminal of each of the A/D conversion circuits 124 is connected to an integrator circuit 125 that is an integration unit. The integrator circuit 125 integrates a current supplied from the constant current circuit 140 and outputs a voltage that is a result of the integration from an output terminal thereof. The output terminal of the integrator circuit 125 is connected to the other input terminal of the comparator circuit 126. An output terminal of the comparator circuit 126 is connected to a digital signal storage circuit 127 that is a digital signal storage unit. Upon receiving a comparison signal output from the comparison circuit 126, the digital signal storage circuit 127 stores a digital signal. The digital signal storage circuit 127 outputs from an output terminal thereof a digital signal as a result of A/D conversion performed by the A/D conversion circuit 124. Digital signals output from the digital signal storage circuits 127 may be output from the solid-state image pickup apparatus 1 via a common terminal or different output terminals.

A resistor 129 is a parasitic resistor on the reference signal supply line 113.

Figure 2:
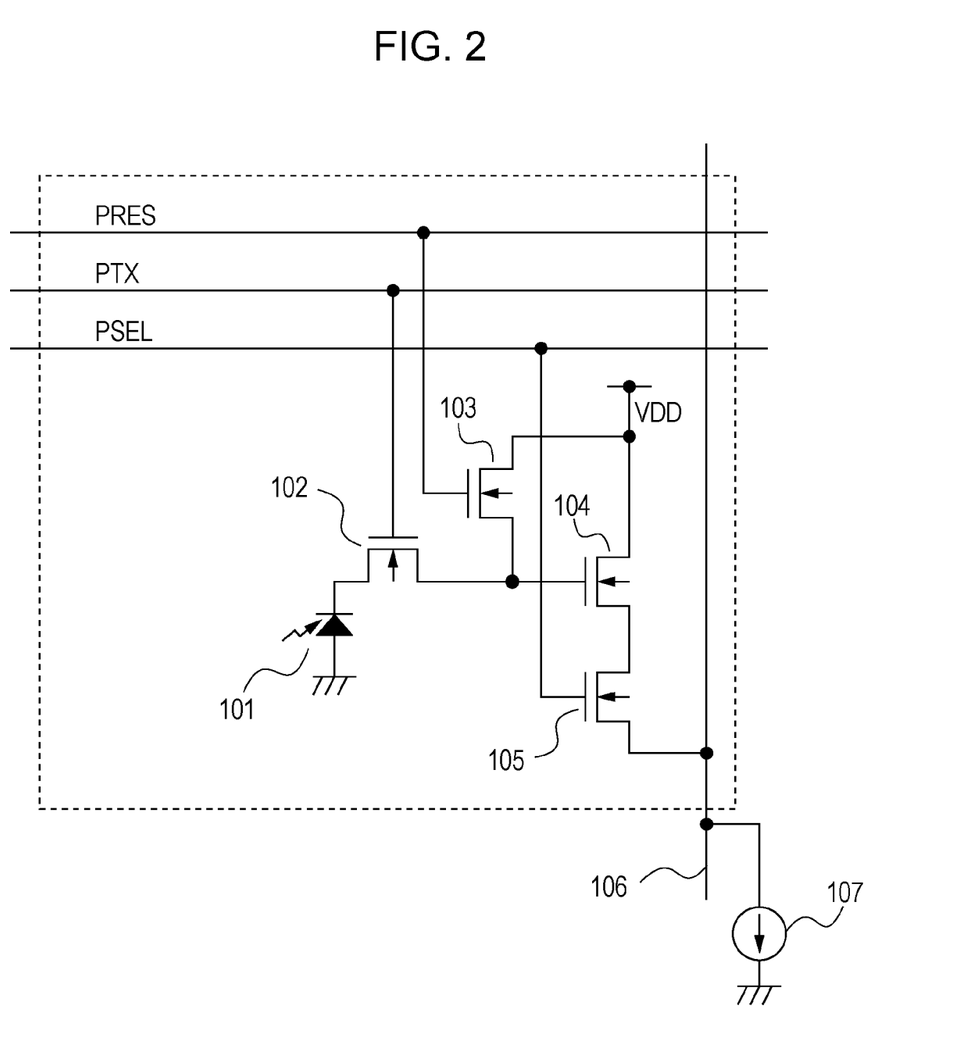
FIG. 2 is a diagram illustrating an exemplary configuration of a pixel according to an embodiment of the present invention.

FIG. 2 is an equivalent circuit diagram illustrating an exemplary configuration of the pixel 100.

A photodiode 101 performs photoelectric conversion in accordance with incident light and stores a generated electrical charge, and has a cathode connected to one main electrode of a transfer MOS transistor 102. The other main electrode of the transfer MOS transistor 102 is connected to one main electrode of a reset MOS transistor 103, and is also connected to a control electrode of an amplification MOS transistor 104. A gate terminal of the amplification MOS transistor 104 is connected to a capacitor (hereinafter referred to as an FD capacitor) of a Floating Diffusion (FD) layer (not illustrated) (hereinafter referred to as an FD unit). The other main electrode of the reset MOS transistor 103 is connected to one main electrode of the amplification MOS transistor 104, and is also connected to a power source VDD. The power source VDD and a switch 111 form a voltage supply unit. The other main electrode of the amplification MOS transistor 104 is connected to the vertical output line 106 via a selection MOS transistor 105. The vertical output line 106 is connected to a constant current source 107.

When the transfer MOS transistor 102 is turned on in response to a signal PTX, an electrical charge stored in the photodiode 101 is transferred to the control electrode of the amplification MOS transistor 104. When the reset MOS transistor 103 is turned on in response to a signal PRES, it resets the potential of the control electrode of the amplification MOS transistor 104 in accordance with a voltage applied by the power source VDD. When the selection MOS transistor 105 is turned on in response to a signal PSEL, the amplification MOS transistor 104 and the constant current source 107 are electrically connected to each other and operate as a source follower circuit. When the source follower circuit is in an operation state, the potential of the vertical output line 106 is changed in accordance with the potential of a gate of the amplification MOS transistor 104. The signals PTX, PRES, and PSEL are supplied from, for example, the vertical scanning circuit 123.

Figure 1B:
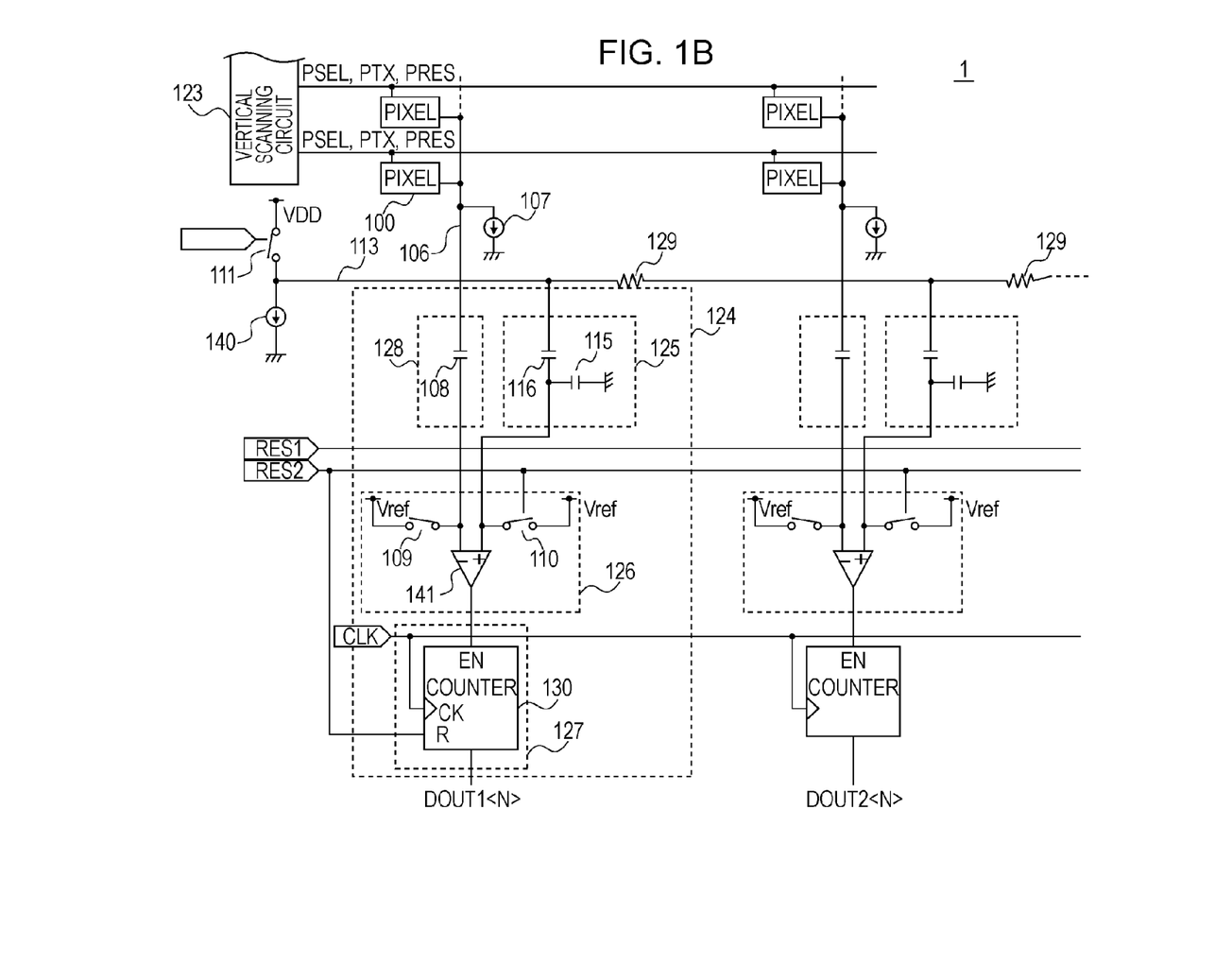

FIG. 1B is a diagram illustrating details of the solid-state image pickup apparatus illustrated in FIG. 1A. The analog signal processing circuit 128 illustrated in FIG. 1B is an analog signal processing unit, and includes a clamp circuit including a clamp capacitor 108 having one terminal connected to the first terminal of the A/D conversion circuit 124. The integrator circuit 125 includes an input capacitor 116 having one terminal connected to the second input terminal of the A/D conversion circuit 124 and a storage capacitor 115 having one terminal connected to the other terminal of the input capacitor 116 and the other terminal connected to the ground. The storage capacitor 115 is a capacitance load at this node. The storage capacitor 115 may be connected to a dedicated capacitance element or may be a parasitic capacitor including an input capacitor of a comparator 141.

The comparator circuit 126 illustrated in FIG. 1B includes switches 109 and 110 and the comparator 141. One terminal of the comparator 141 is connected to the other terminal of the clamp capacitor 108, and is also connected to a reference voltage power source Vref via the switch 109. The other terminal of the comparator 141 is connected to the other terminal of the input capacitor 116, and is also connected to the reference voltage power source Vref via the switch 110. The switch 109 is switched between conducting state and non-conducting state in response to a signal RES1. The switch 110 is switched between conducting state and non-conducting state in response to a signal RES2. The logical threshold value of the comparator 141 is a negative value slightly below zero. Accordingly, the following description will be made under the assumption that the comparator 141 with two input terminals having the same potential outputs a high-level signal.

The digital signal storage circuit 127 illustrated in FIG. 1B includes a counter 130. The counter 130 performs a counting operation in synchronization with a reference clock CLK, and terminates or starts the counting operation in accordance with a signal that is output from the comparator 141 and is then input into an activation input terminal EN. In response to the signal RES2, the counter 130 resets a count value stored therein.

The reference signal supply line 113 illustrated in FIG. 1B is connected to the constant current circuit 140 and the switch 111. When the switch 111 is turned on in response to a signal RES3, the voltage of the reference signal supply line 113 is reset to a power source voltage VDD.

Next, the operation of the solid-state image pickup apparatus illustrated in FIG. 1B will be described with reference to FIG. 3. Reference numerals provided for signal pulses correspond to those provided for terminals illustrated in FIGS. 1B and 2. Each switch illustrated in FIGS. 1B and 2 is turned on, or brought into a conducting state, when a high-level signal is transmitted thereto, and is turned off, or brought into a non-conducting state when a low-level signal is transmitted thereto.

Figure 3:
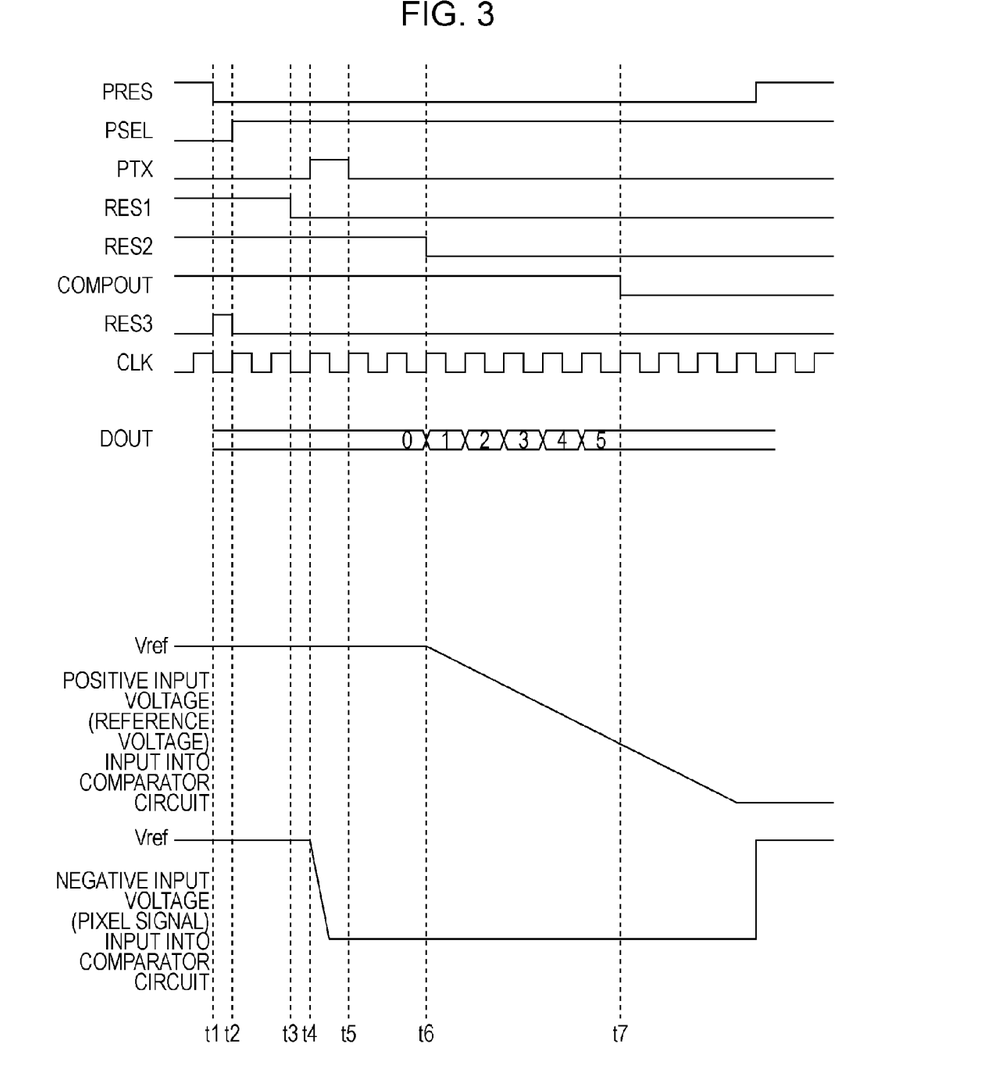
FIG. 3 is a timing chart of a solid-state image pickup apparatus according to the first embodiment.

It is assumed that a predetermined exposure period of time has elapsed before a time t3 illustrated in FIG. 3 and an electrical charge obtained from photoelectric conversion is stored in the photodiode 101. Referring to FIG. 3, COMPOUT denotes the output of the comparator 141.

At a time t1, the level of the signal PRES is changed from high to low, so that an operation for resetting the gate terminal of the amplification MOS transistor 104, that is, the FD unit, ends. As a result, the FD capacitor that is a capacitor included in the FD unit holds a voltage generated at the time of reset of the FD unit, that is, a dark-state voltage.

Furthermore, at the time t1, the level of the signal RES3 is changed to high, so that the voltage of the reference signal supply line 113 is reset to the power source voltage VDD that is a fixed voltage. As a result, the voltage of one terminal of the input capacitor 116 provided in each column is reset to the power source voltage VDD.

At a time t2, the level of the signal RES3 is changed to low. At that time, since the reference signal supply line 113 is connected only to the constant current circuit 140, a discharge from one terminal of the input capacitor 116 provided in each column is started. Subsequently, after a period of time corresponding to a time constant that is determined by the total sum of resistance values of the parasitic resistors 129 on the reference signal supply line 113 and the total sum of capacitance values of the input capacitors 116 has elapsed, a discharging current output from one terminal of the input capacitor 116 provided in each column is stabilized in a steady state. In the steady state, a potential gradient occurs on the reference signal supply line 113 due to the parasitic resistors 129. However, if the capacitance values of the input capacitors 116 that are individually provided in columns are the same, the same amount of current flows out from one terminals of the input capacitors 116.

Furthermore, at the time t2, the level of the signal PSEL is changed to high, so that the selection MOS transistor 105 is brought into a conducting state and the amplification MOS transistor 104 and the constant current source 107 form a source follower circuit. As a result, a dark-state output of a level corresponding to the fact that the FD unit has been reset at the time t1 appears in the vertical output line 106 and is then input into one terminal of the clamp capacitor 108.

At a time t3, when the level of the signal RES1 is changed to low, the switch 109 is turned off and a level appearing in the vertical output line 106 is clamped to the clamp capacitor 108. Since a period from the time t1 to the time t3 is sufficiently short, the level clamped at the time t3 can be handled as a level corresponding to the reset of the FD unit at the time t1.

During a period from the time t4 to a time t5, the signal PTX is at a high level, so the transfer MOS transistor 102 is turned on and an electrical charge stored in the photodiode 101 is transferred to the FD unit. The potential of the FD unit is changed in accordance with the amount of electrical charge transferred. A level appearing in the vertical output line 106 is changed in accordance with the change in the potential of the FD unit. At that time, since the other terminal of the clamp capacitor 108 is in an electrically floating state, only the amount of change from the dark-state output that has been clamped at the time t3 is input into one terminal of the comparator 141. That is, a signal with reduced noise caused by MOS transistors included in each of the pixels 100 and reduced random noise caused by resetting the FD unit is input into one terminal of the comparator 141.

The above-described change in potential will be described using an equation. If an electrical charge transferred from the photodiode 101 to the FD unit is an electron, the absolute value of the amount of the electrical charge is Q, and the capacitance value of the FD unit is CFD, the potential of the FD unit decreases by Q/CFD. In response to this, the level of the vertical output line 106 is changed and is then applied to one terminal of the clamp capacitor 108 as a light-state output. If the gain of the source follower circuit formed by the amplification MOS transistor 104 and the constant current source 107 is Gsf, the amount of change ΔVv1 in a potential Vv1 of the vertical output line 106 from the dark-state output can be represented by the following equation.

$$\Delta Vv1 = -\frac{Q}{CFD} \cdot Gsf \quad (1)$$

Since the amount of potential change ΔVv1 is sent to one terminal, that is, a negative input terminal of the comparator 141, the potential of the negative input terminal is a value obtained from the following equation.

$$Vsig = Vref - \frac{Q}{CFD} \cdot Gsf = Vref - \Delta Vv1 \quad (2)$$

Subsequently, at a time t6, an A/D conversion operation is started. At the time t6, the level of the signal RES2 is changed to low, so the switch 110 is turned off. As a result, an electrical charge stored in the storage capacitor 115 is output by a discharging current Iref via the input capacitor 116 and the reference signal supply line 113. This can be treated as having the same meaning as time integration of the discharging current Iref. If the capacitance values of the storage capacitors 115 that are individually provided in columns are the same value Cs, a potential Vramp of the other input terminal, that is, a positive input terminal of the comparator 141 decreases by a constant gradient Iref/Cs. This means that a reference signal with the gradient Iref/Cs is input into the comparator 141. The potential Vramp of the positive input terminal of the comparator 141 at a certain time t (the time t is a time after the time t6) is represented by the following equation as the function of the time t. In the following, Vramp is also referred to as a reference voltage.

$$Vramp = Vref - \frac{Iref}{Cs} \cdot (t - t6) \quad (3)$$

The important thing here is that the same initial potential Vref is applied to the positive input terminals of the comparators 141 that are individually provided in columns at the time t6 and the same amount of change Iref/Cs in the potential of the positive input terminal with time occurs in these columns. Even if a potential gradient occurs at one terminal of the input capacitor 116 in each column after the level of the signal RES3 has been changed to low at the time t2, a potential applied to the positive input terminal of each comparator as a reference signal is not affected by the potential gradient. Accordingly, the occurrence of shading in a direction along a row, which may be an issue in the related art, can be suppressed.

As illustrated in FIG. 1B, the signal RES2 is input into a reset terminal R of the counter 130. Accordingly, if the level of the signal RES2 is changed to low at the time t6, the reset state of the counter 130 is released and the counter 130 starts the counting operation in synchronization with a reference clock CLK.

Here, if a period from the time t2 at which a discharge from one terminal of the input capacitor 116, that is, the integration operation, is started to a time at which the A/D conversion operation is started ranges from a period corresponding to one clock of the reference clock CLK to a period that is approximately ten times of a time constant represented by (the total sum of values of the parasitic resistors on the reference signal supply line 113)×(the total sum of values of the input capacitors 116), currents discharged from the input capacitors 116 become sufficiently uniform. Accordingly, the period from the time at which the integration operation is started by the integrator circuit 125 to the time at which the A/D conversion operation is started is set to a period that is equal to or shorter than ten times of the time constant of the reference signal supply line 113 which includes the total sum of values of the input capacitors 116.

At a time t7, the level of the reference voltage Vramp applied to the positive input terminal of the comparator 141 becomes below the level of a signal Vsig input into the negative input terminal of the comparator 141, the level of the comparison signal COMPOUT that is an output of the comparator 141 is changed from high to low. The comparison signal COMPOUT is input into the activation input terminal EN of the counter 130. Accordingly, if the level of the comparison signal COMPOUT is changed to low, the counter 130 stops the counting operation while holding the last count value. At that time, a counter output DOUT obtained from the counter 130 is a count value corresponding to a signal represented by equation (1). That is, the counter 130 has a function of storing a digital signal corresponding to an analog signal output from the pixel 100.

As described previously, in a solid-state image pickup apparatus according to the first embodiment of the present invention, it is possible to supply a uniform reference signal to the comparators 141 that are individually provided in columns without being affected by the potential gradient that occurs on the reference signal supply line 113. Accordingly, it is possible to suppress the occurrence of shading in a direction along a row, which may be an issue in the related art.

In this embodiment, an exemplary case in which six pixels 100 are arranged in a matrix having two rows and three columns has been described. However, the number of pixels 100 included in the pixel array PA is not limited thereto. Furthermore, the configuration of the pixels 100 is not limited to the configuration represented by the exemplary equivalent circuit illustrated in FIG. 2.

Furthermore, in this embodiment, the voltage of the reference signal supply line 113 is reset to the power source voltage VDD that is a fixed voltage and then the potential of the reference signal supply line 113 is lowered by the constant current circuit 140. However, the polarity of the reference signal supply line 113 may be inverted. That is, the voltage of the reference signal supply line 113 may be reset to GND that is a fixed voltage, and then the potential of the reference signal supply line 113 may be increased by the constant current circuit 140.

Next, the second embodiment of the present invention will be described with reference to FIGS. 4 and 5.

Figure 4:
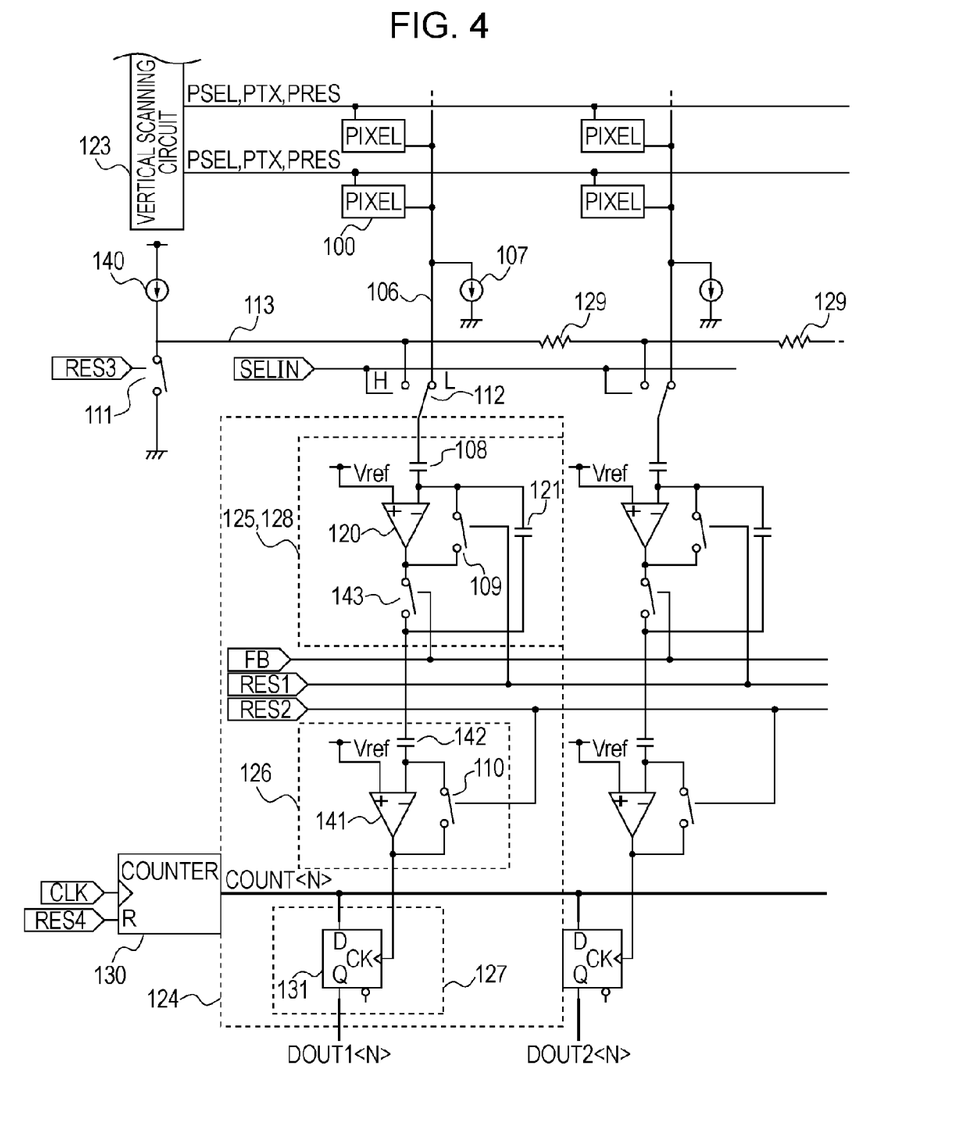
FIG. 4 is a diagram illustrating an exemplary configuration of a solid-state image pickup apparatus according to a second embodiment of the present invention.
Figure 5:
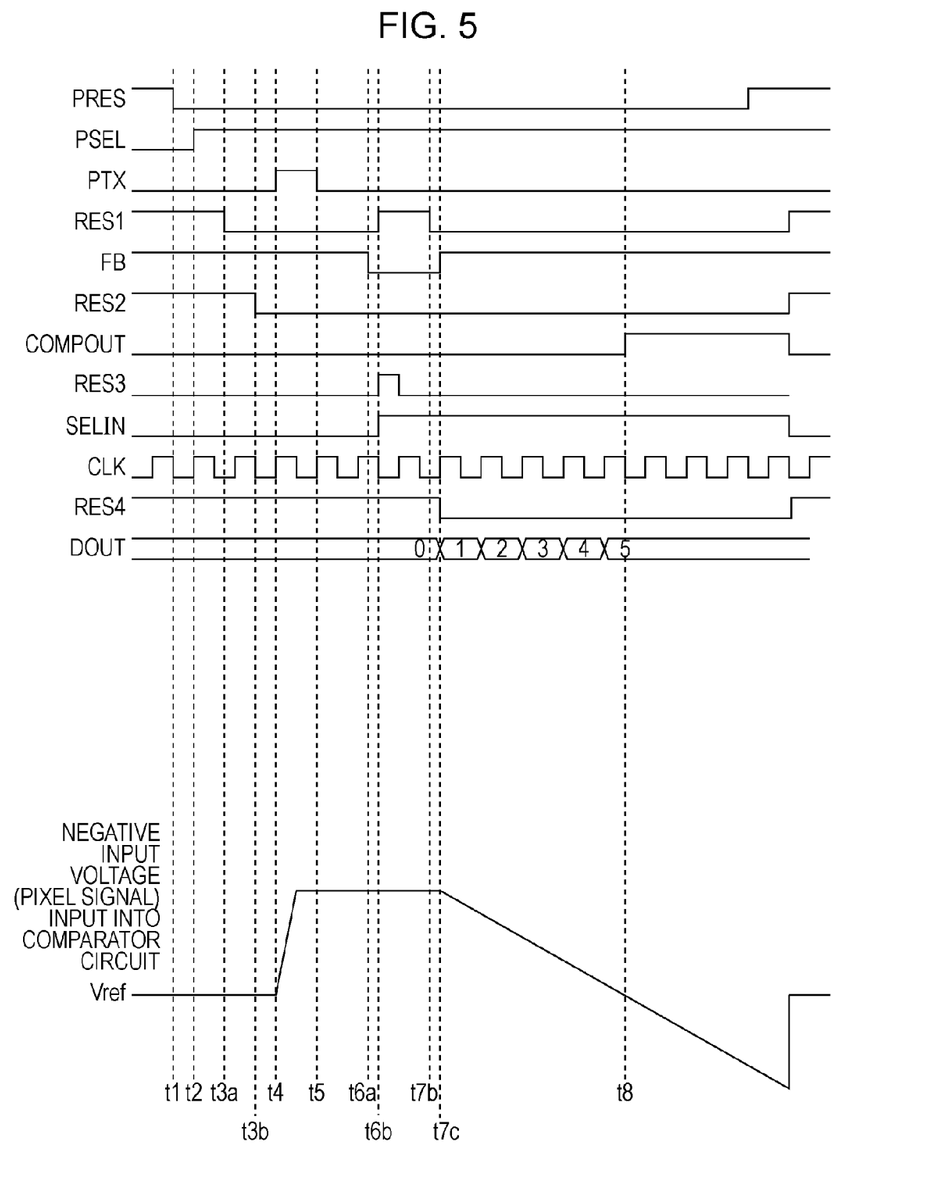
FIG. 5 is a timing chart of a solid-state image pickup apparatus according to the second embodiment.

FIG. 4 is an equivalent circuit diagram illustrating an exemplary configuration of a solid-state image pickup apparatus according to the second embodiment of the present invention. The difference between the second embodiment and the first embodiment is that the integrator circuit 125 and the analog signal processing circuit 128 are integrated. Furthermore, the digital signal storage circuit 127 includes an N-bit flip-flop 131. A counter 130 supplies a common N-bit counter signal to the flip-flops 131 that are individually provided in columns. In the first embodiment, the power source voltage VDD is applied to the reference signal supply line 113 and then the potential of the reference signal supply line 113 is lowered by the constant current circuit 140. On the contrary, in this embodiment, the potential of the reference signal supply line 113 is reset to GND and is then increased by the constant current circuit 140. Furthermore, the input portion of the integration unit is connected to the vertical output line 106 or the reference signal supply line 113 via a switch 112.

Although a logical threshold value of the comparator 141 is a negative value slightly below zero in the first embodiment, it is a positive value slightly greater than zero in this embodiment. If the potentials of two input terminals of the comparator 141 are the same, the comparator 141 outputs a low-level signal. If the potential of the positive input terminal of the comparator 141 is higher than that of the negative input terminal thereof, the comparator 141 outputs a high-level signal.

An operation according to this embodiment will be described with reference to FIG. 5. The configuration of the pixel 100 according to this embodiment is the same as that of the pixel 100 according to the first embodiment which is illustrated in the equivalent circuit diagram in FIG. 2. It is assumed that a predetermined exposure period of time has elapsed before a time t4 and an electrical charge obtained from photoelectric conversion is stored in the photodiode 101. Referring to FIG. 5, COMPOUT denotes the output of the comparator 141.

At a time t1, the level of the signal PRES is changed from high to low, so an operation for resetting the gate terminal of the amplification MOS transistor 104, that is, the FD unit, ends. As a result, the FD capacitor that is a capacitor included in the FD unit stores a voltage generated at the time of reset of the FD unit, that is, a dark-state voltage.

Furthermore, at the time t1, since the levels of the signal RES1 and a signal FB are high, both ends of a feedback capacitor 121 are short-circuited and a voltage across the feedback capacitor 121 becomes zero.

At a time t2, the level of the signal PSEL is changed to high, so that the selection MOS transistor 105 is brought into conduction and the amplification MOS transistor 104 and the constant current source 107 form a source follower circuit. As a result, a dark-state output of a level corresponding to the fact that the FD unit has been reset at the time t1 appears in the vertical output line 106 and is then input into one terminal of the clamp capacitor 108.

At a time t3a, the level of the signal RES1 is changed to low, so the switch 109 is turned off and a level appearing in the vertical output line 106 is clamped to the clamp capacitor 108. Since a period from the time t1 to the time t3a is sufficiently short, the level clamped at the time t3a can be handled as a level corresponding to the reset of the FD unit at the time t1.

At a time t3b, the level of the signal RES2 is changed to low, so the switch 110 is turned off and the offset of the integrator circuit 125 is clamped to a connection capacitor 142.

During a period from the time t4 to a time t5, the signal PTX is at a high level, so the transfer MOS transistor 102 is turned on and an electrical charge stored in the photodiode 101 is transferred to the FD unit. The potential of the FD unit is changed in accordance with the amount of electrical charge transferred. A level appearing in the vertical output line 106 is changed in accordance with the change in the potential of the FD unit. At that time, since a terminal of the clamp capacitor 108 which is connected to an inverting input terminal of a computation amplifier 120 that is a differential amplifier is in an electrically floating state, only the amount of change from the dark-state output that has been clamped at the time t3a is input into the inverting input terminal of the computation amplifier 120. That is, a signal with reduced noise caused by MOS transistors included in each of the pixels 100 and reduced random noise caused by resetting the FD unit is input into the inverting input terminal of the computation amplifier 120.

The above-described change in potential will be further described in detail using an equation. If an electrical charge transferred from the photodiode 101 to the FD unit is an electron, the absolute value of the amount of the electrical charge is Q, and the capacitance value of the FD unit is CFD, then the potential of the FD unit decreases by Q/CFD. In response to this, the level of the vertical output line 106 is changed and is then applied to one terminal of the clamp capacitor 108 as a light-state output. If the gain of the source follower circuit formed by the amplification MOS transistor 104 and the constant current source 107 is Gsf, the amount of change ΔVv1 in the potential Vv1 of the vertical output line 106 from the dark-state output can be represented by the following equation.

$$\Delta Vv1 = -\frac{Q}{CFD} \cdot Gsf \quad (4)$$

The amount of potential change ΔVv1 is amplified by an inverting amplification circuit formed by the computation amplifier 120, the clamp capacitor 108, and the feedback capacitor 121, and an amplified signal Vs is stored in the feedback capacitor 121. The amplified signal Vs is represented by the following equation.

$$Vs = \frac{Q}{CFD} \cdot Gsf \cdot \frac{C0}{Cf} = \Delta Vv1 \cdot \left(-\frac{C0}{Cf}\right) \quad (5)$$

In equation (5), C0 denotes a capacitance value of the clamp capacitor 108 and Cf denotes a capacitance value of the feedback capacitor 121. As is apparent from equation (5), the gain of the inverting amplification circuit is −C0/Cf.

The level of the signal FB is changed to low at a time t6a and the level of the signal RES1 is changed to high at a time t6b, so the switch 109 is turned on and the computation amplifier 120 operates as a voltage follower. At that time, since the output terminal of the computation amplifier 120 is connected to a node A to which the clamp capacitor 108, the feedback capacitor 121, and the inverting input terminal of the computation amplifier 120 are connected, the offset of the computation amplifier 120 is canceled at the node A. Furthermore, the voltage of the node A can be reset to the reference voltage Vref.

At the time t6b, the level of a signal SELIN is changed to high, so one terminal of the clamp capacitor 108 is connected to the reference signal supply line 113 via the switch 112 that is a switch unit. Furthermore, at the time t6b, the level of the signal RES3 is changed to high, so the reference signal supply line 113 and one terminal of the clamp capacitor 108 are reset to GND. When the level of the signal RES3 is changed to low and the switch 111 is turned off, a charging process of charging the clamp capacitors 108 that are individually provided in columns using the constant current circuit 140 is started. After the level of the signal RES3 has been changed to low and a period corresponding to a time constant that is determined by the product of the total sum of values of the parasitic resistors 129 on the reference signal supply line 113 and the total sum of values of the clamp capacitors 108 has elapsed, the charging process is performed in a steady state. As described in the first embodiment, if a period from the time at which the integration operation is started to the time at which the A/D conversion operation is started ranges from a period corresponding to one clock of the reference clock CLK of to a period that is approximately ten times of a time constant represented by (the total sum of values of the parasitic resistors on the reference signal supply line 113)×(the total sum of values of the input capacitor 116), currents discharged from the input capacitors 116 become sufficiently uniform.

The level of the signal RES1 is changed to low at a time t7b and the level of the signal FB is changed to high at a time t7c, the switch 109 is turned off and a switch 143 is turned on. As a result, the constant current circuit 140 charges the clamp capacitor 108 using the constant current value Iref. Accordingly, an output Vout of the integrator circuit 125 decreases with time by the constant gradient Iref/Cs. The output Vout at a time t (the time t is a time after the time t7c) is represented by the following equation.

$$Vout = Vref + \frac{Q}{CFD} \cdot Gsf \cdot \frac{C0}{Cf} - \frac{Iref}{Cf} \quad (6)$$

At the time t7c, the level of a signal RES4 is changed to low, so the reset state of the counter 130 is released and the counter 130 starts the counter operation. A count value output from the counter 130 is input into the flip-flops 131 that are individually provided in columns.

At a time t8, the level of the output Vout of the integrator circuit 125 decreases below the level of the reference voltage power source Vref, so the level of the output of the comparator 141 is changed from low to high. The output of the comparator 141 is input into a clock terminal CK of the flip-flop 131, and the count value of the counter 130 obtained when the level of the output of the comparator 141 is changed to high is latched into the flip-flop 131. The value latched into the flip-flop 131 at that time is a digital value corresponding to an analog signal output from the pixel 100.

According to this embodiment, since the integrator circuit 125 and the analog signal processing circuit 128, which are separately disposed in the first embodiment, are integrated, the gain error between columns can be reduced. The reason for this is that the same clamp capacitor 108 and the same feedback capacitor 121 are used in the process of integrating a current supplied from the constant current circuit 140 and the process of amplifying an analog signal output from a pixel and errors caused by the relative accuracy of capacitors therefore cancel each other. Accordingly, according to this embodiment, a solid-state image pickup apparatus capable of reducing the gain error between columns and having a high S/N ratio can be achieved.

In a solid-state image pickup apparatus according to this embodiment, since the clamp capacitor 108 functions as the input capacitor 116 described in the first embodiment, the number of elements included in a circuit can be reduced. This is an improvement especially when column A/D conversion circuits are incorporated in a solid-state image pickup apparatus including closely-spaced columns.

Next, the third embodiment of the present invention will be described with reference to FIG. 6.

Figure 6:
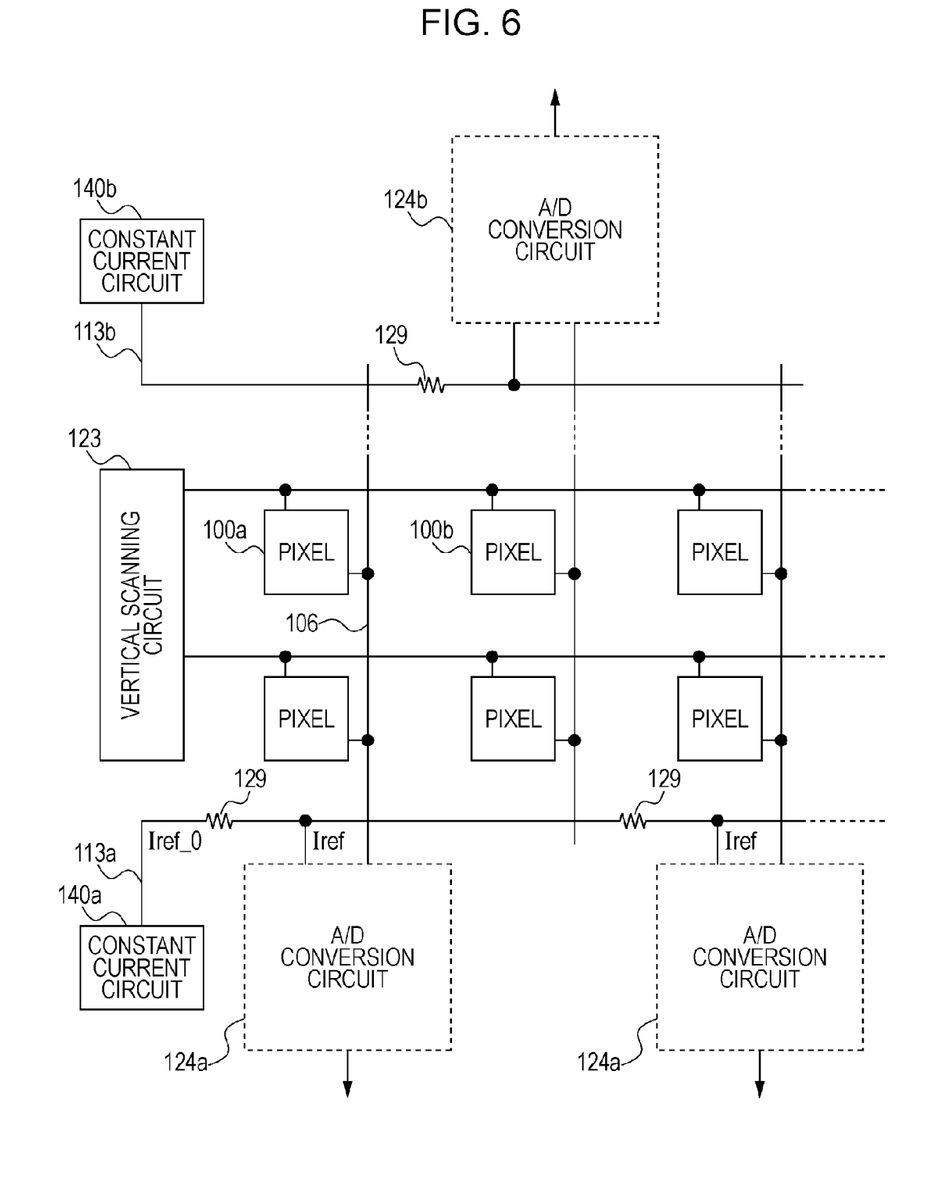
FIG. 6 is a schematic diagram of a solid-state image pickup apparatus according to a third embodiment of the present invention.

FIG. 6 is a schematic diagram illustrating a configuration of a solid-state image pickup apparatus according to this embodiment. A solid-state image pickup apparatus according to the third embodiment differs from solid-state image pickup apparatuses according to the first and second embodiments in that an A/D conversion circuit 124a used for pixels 100a in odd-numbered columns included in a pixel array and an A/D conversion circuit 124b used for pixels 100b in even-numbered columns included in the pixel array are disposed on opposite sides. In this embodiment, an available area for each of the A/D conversion circuits 124a and 124b that are individually provided in columns can be twice that for each A/D conversion circuit in solid-state image pickup apparatuses according to the first and second embodiments.

Referring to FIG. 6, the pixels 100a in odd-numbered columns are connected to corresponding ones of the A/D conversion circuits 124a, and the pixels 100b in even-numbered columns are connected to corresponding ones of the corresponding A/D conversion circuits 124b. One input terminals of the A/D conversion circuits 124a are connected to a constant current circuit 140a, and one input terminals of the A/D conversion circuits 124b are connected to a constant current circuit 140b. That is, a single constant current circuit is provided for an A/D conversion unit group composed of the A/D conversion circuits 124a used for pixels in odd-numbered columns, and a single constant current circuit is provided for an A/D conversion unit group composed of the A/D conversion circuits 124b used for pixels in even-numbered columns. The configuration of the A/D conversion circuits 124a and 124b may be the same as that described in the first or second embodiment.

It can be considered that reference signal supply lines 113a and 113b are electrically connected to each other. In this case, only a single constant current circuit is disposed. However, since a line for connecting the reference signal supply lines 113a and 113b is provided, the time constants of these reference signal supply lines are increased.

On the contrary, if the reference signal supply lines 113a and 113b are separately provided and are connected to the constant current circuits 140a and 140b, respectively as illustrated in FIG. 6, the time constants of these reference signal supply lines can be lowered. If the time constants are lowered, a period of time until the charging process or the discharging process is performed in a steady state in an integrator circuit included in an A/D conversion circuit can be shortened. This leads to an enhanced operation speed.

Figure 7:
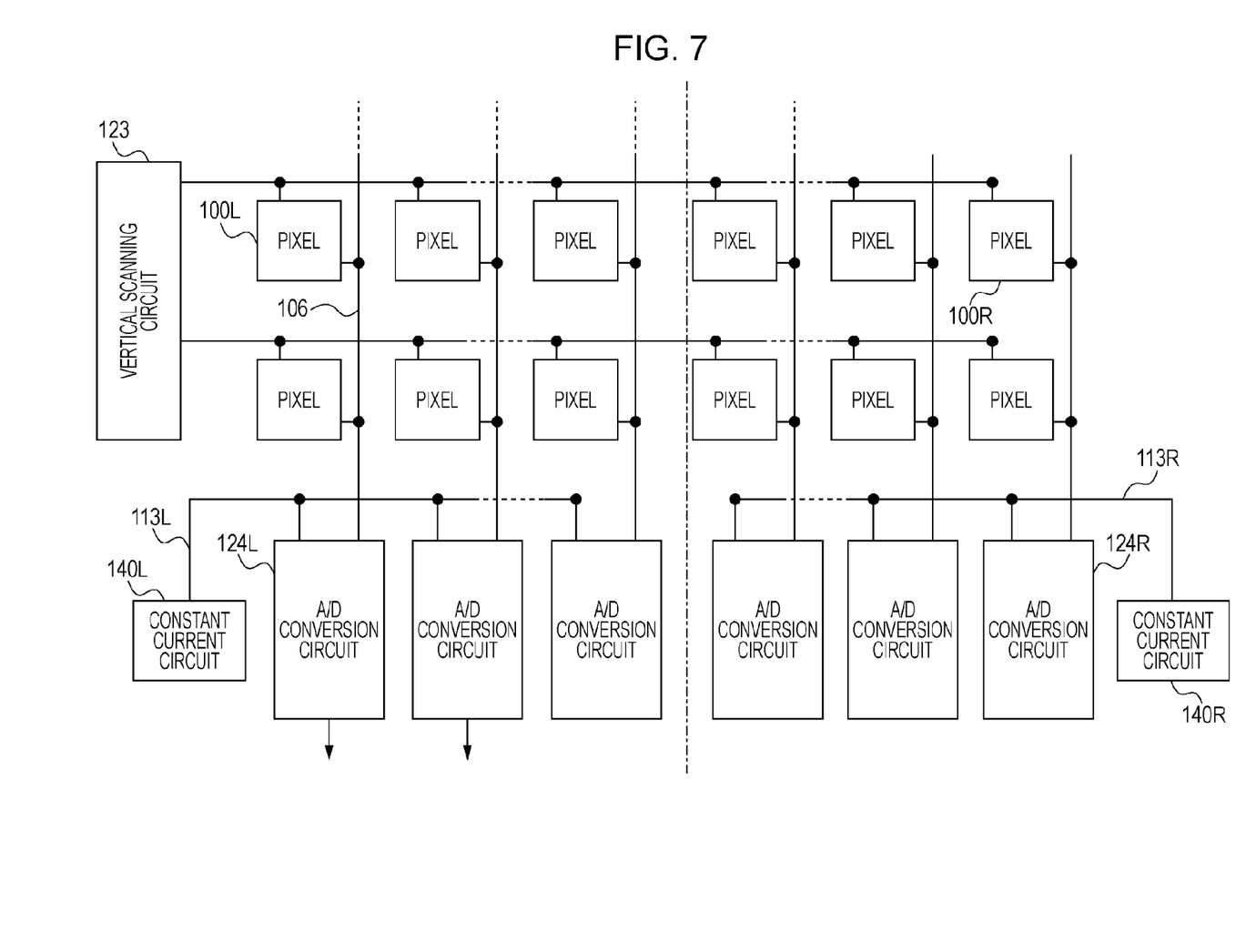
FIG. 7 is a schematic diagram of a solid-state image pickup apparatus according to a fourth embodiment of the present invention.

FIG. 7 is a schematic diagram illustrating a configuration of a solid-state image pickup apparatus according to the fourth embodiment of the present invention.

In this embodiment, the pixel array PA is divided into a pixel array on the left side (denoted as "L", e.g., 100L) and a pixel array on the right side (denoted as "R", e.g., 100R). That is, an A/D conversion circuit 124L used for a column on the left side of the pixel array PA and an A/D conversion circuit 124R used for a column on the right side of the pixel array PA are connected to different constant current circuits. As a result, the length of the reference signal supply line 113 can be reduced by approximately half as compared in the first and second embodiments, and the time constant of the reference signal supply line can be therefore lowered. Accordingly, a period of time until the charging process or the discharging process is performed in a steady state by the constant current circuit can be shortened. This leads to an enhanced operation speed.

Although the pixel array is divided into two groups as illustrated in FIG. 7, it may be divided into three or more groups. Furthermore, the number of A/D conversion circuits included in each of groups into which a pixel array is divided may vary from group to group.

Although monochrome solid-state image pickup apparatuses have been described in the first to fourth embodiments for simplification of explanation, a color filter may be provided for each pixel.

Figure 8:
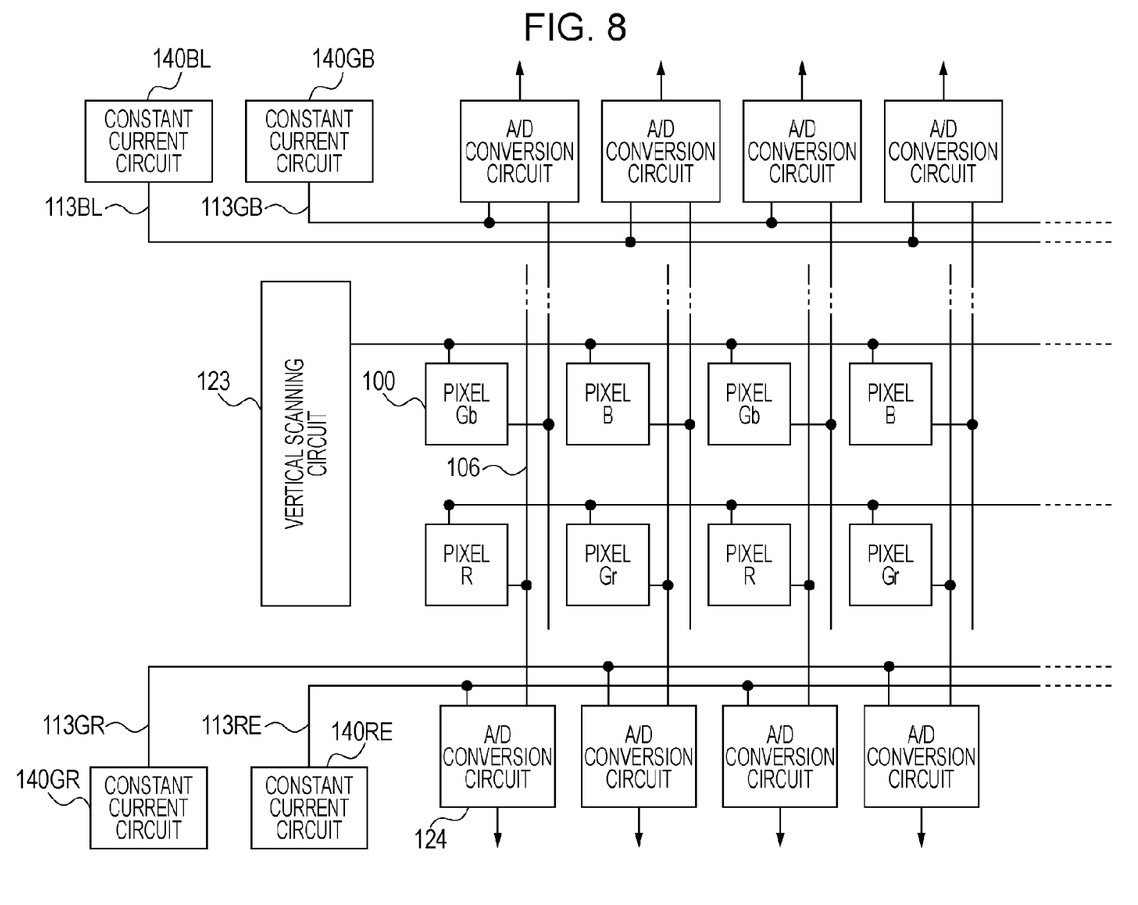
FIG. 8 is a schematic diagram of a solid-state image pickup apparatus according to a fifth embodiment of the present invention.

FIG. 8 is a schematic diagram illustrating a configuration of a solid-state image pickup apparatus according to the fifth embodiment of the present invention.

Referring to FIG. 8, a Bayer color filter is provided for pixels included in the pixel array PA. Gb and Gr indicate that a color filter for transmitting green light is placed on a pixel, B indicates that a color filter for transmitting blue light is placed on a pixel, and R indicates that a color filter for transmitting red light is placed on a pixel.

In this embodiment, pixels on which Gb, Gr, B, and R color filters are placed are connected to different A/D conversion circuits. FIG. 8 illustrates an array including two rows. In the case of an array including three or more rows, pixels in the same column on which color filters of the same color are individually placed are connected to a common A/D conversion circuit.

The A/D conversion circuits that are individually connected to pixels on which color filters of different colors are placed are connected to different constant current circuits. Referring to FIG. 8, a constant current circuit 140GB is provided for pixels on which the Gb color filters are placed, and a constant current circuit 140GR is provided for pixels on which the Gr color filters are placed. Furthermore, a constant current circuit 140BL is provided for pixels on which the B color filters are placed, and a constant current circuit 140RE is provided for pixels on which the R color filters are placed. A low current supplied from each constant current circuit is set in accordance with the transmittance of light output from a reference illuminant which is set for a color filter placed on a corresponding pixel. More specifically, a low current output from each constant current circuit is adjusted so that substantially the same digital value can be obtained in each pixel when the image of a subject illuminated with light output from a reference illuminant is captured. As a result, it is possible to easily process a signal output from a solid-state image pickup apparatus. This can reduce the load on a signal processing circuit at a subsequent stage.

It is noted that the reference signal line 113 is denoted as 113BL, 113GB, 113GR, and 113RE for pixels with B color filters, Gb color filters, Gr color filters, and R color filters, respectively.

Figure 9:
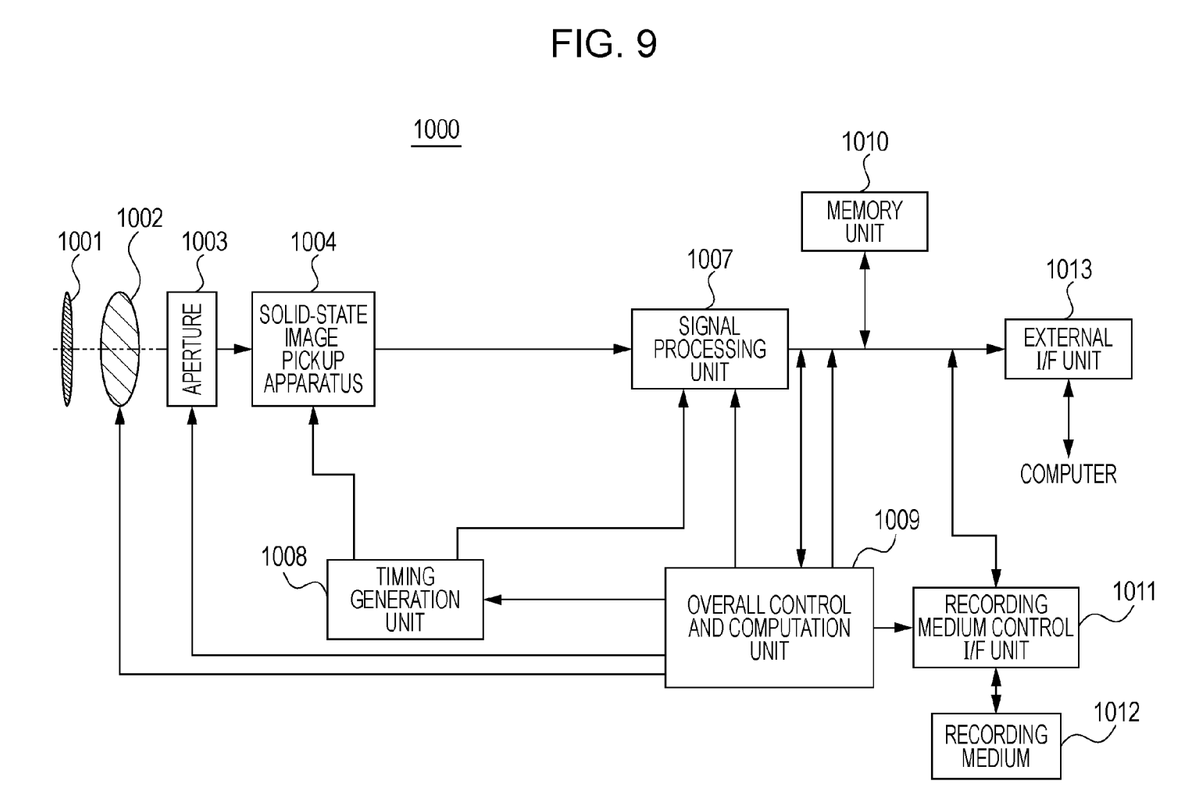
FIG. 9 is a diagram illustrating an exemplary configuration of a solid-state image pickup system according to a sixth embodiment of the present invention.

FIG. 9 is a diagram illustrating a configuration of a solid-state image pickup system 1000 that uses a solid-state image pickup apparatus according to any one of the embodiments of the present invention. A barrier 1001 doubles as a protection for a lens 1002 and a main switch. The lens 1002 that is an optical system forms an optical image of a subject on a solid-state image pickup apparatus 1004. The quantity of light transmitted through the lens 1002 is changed by an aperture 1003. The solid-state image pickup apparatus 1004 (corresponding to a solid-state image pickup apparatus according to any one of the embodiments) converts the optical image formed by the lens 1002 into image data. A signal processing unit 1007 performs various corrections upon the image data output from the solid-state image pickup apparatus 1004 and compresses the image data. A timing generation unit 1008 outputs various timing signals to the signal processing unit 1007. The signal processing unit 1007 and the timing generation unit 1008 may be formed on the same chip as that on which the solid-state image pickup apparatus 1004 is formed. The solid-state image pickup system 1000 includes an overall control and computation unit 1009 for performing various computations and overall control of the solid-state image pickup system 1000, a memory unit 1010 for temporarily storing image data, and a recording medium control interface unit 1011 for recording/reading data in/from a recording medium. Furthermore, the solid-state image pickup system 1000 includes a recording medium 1012 from which a semiconductor memory or the like for recording/reading image data in/from the recording medium 1012 is removable and an external interface (I/F) unit 1013 for communicating with an external computer or the like.

Next, the operation of the solid-state image pickup system 1000 illustrated in FIG. 9 will be described. When the barrier 1001 is opened, a main power source, a power source for a control system such as the overall control and computation unit 1009, and a power source for an image pickup system circuit such as the solid-state image pickup apparatus 1004 are turned on in this order.

Subsequently, an operation for controlling the amount of exposure is performed. The overall control and computation unit 1009 opens the aperture 1003. A signal output from the solid-state image pickup apparatus 1004 at that time is input into the signal processing unit 1007. The signal processing unit 1007 causes the overall control and computation unit 1009 to perform an exposure amount computation on the basis of the signal. The overall control and computation unit 1009 detects the brightness of a subject on the basis of a result of the computation and controls the aperture 1003. The overall control and computation unit 1009 performs the brightness detection by, for example, performing a comparison with data that is stored therein in advance.

Subsequently, the overall control and computation unit 1009 extracts a high-frequency component from a signal output from the solid-state image pickup apparatus 1004, computes the distance to the subject on the basis of the high-frequency component, drives the lens 1002, and determines whether the lens 1002 in an in-focus state. When the overall control and computation unit 1009 determines that the lens 1002 is not in the in-focus state, it redrives the lens 1002 so as to compute the distance. The overall control and computation unit 1009 performs the determination by, for example, performing a comparison with data that is stored therein in advance.

When the overall control and computation unit 1009 determines that the lens 1002 is in the in-focus state, final exposure is started. After the exposure has been completed, an image signal output from the solid-state image pickup apparatus 1004 is processed by the signal processing unit 1007 and is then stored in the memory unit 1010 by the overall control and computation unit 1009. Subsequently, data stored in the memory unit 1010 is recorded in the removable recording medium 1012 such as a semiconductor memory via the recording medium control I/F unit 1011 under the control of the overall control and computation unit 1009. The data may be directly input into a computer or the like via the external I/F unit 1013.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2008-281867 filed Oct. 31, 2008, which is hereby incorporated by reference herein in its entirety.

What is claimed is:

1. An apparatus comprising:
a pixel array in which a plurality of pixels for outputting an analog signal are arranged in a matrix;
a plurality of vertical output lines each of which is connected to corresponding ones of the plurality of pixels in a same column of the pixel array;
a plurality of A/D conversion units, which are individually connected to the plurality of vertical output lines, configured to convert the analog signal into a digital signal; and
a constant current supply unit configured to supply a constant current to the plurality of A/D conversion units, and
wherein each of the plurality of A/D conversion units includes,
an integration unit configured to integrate the constant current,
a comparison unit configured to compare the integrated constant current with the analog signal and output a comparison signal, and
a digital signal storage unit configured to store a digital signal corresponding to the comparison signal,
wherein the integration unit includes an input capacitor configured to receive the constant current from one terminal thereof,
wherein the comparison unit is connected to the constant current supply unit via the input capacitor,
wherein the constant current supply unit is provided for each A/D conversion unit group composed of corresponding ones of the plurality of A/D conversion units,
wherein a Bayer color filter is provided for the plurality of pixels included in the pixel array, and
wherein the A/D conversion unit group is provided for corresponding ones of the plurality of pixels on which color filters of the same color are individually placed.

2. The apparatus according to claim 1, wherein the integration unit includes a differential amplifier having an inverting input terminal connected to the other terminal of the input capacitor.

3. The apparatus according to claim 2, wherein the integration unit further includes a feedback capacitor configured to connect the inverting input terminal and an output terminal of the differential amplifier to each other.

4. The apparatus according to claim 3, wherein one terminal of the input capacitor is connected to the constant current supply unit or corresponding one of the plurality of vertical output lines.

5. The apparatus according to claim 1, further comprising a voltage supply unit configured to supply a fixed voltage to one terminal of the input capacitor via a reference signal supply line, and
wherein the integration unit starts an integration operation for integrating the constant current after the voltage supply unit sets a voltage of one terminal of the input capacitor to the fixed voltage, and
wherein a period from a time at which the integration operation is started to a time at which each of the plurality of A/D conversion units starts an A/D conversion operation is a period that is equal to or less than ten times of a time constant of the reference signal supply line.

6. An apparatus comprising:
a pixel array in which a plurality of pixels for outputting an analog signal are arranged in a matrix;
a plurality of vertical output lines each of which is connected to corresponding ones of the plurality of pixels in a same column of the pixel array;
a plurality of A/D conversion units, which are individually connected to the plurality of vertical output lines, configured to convert the analog signal into a digital signal;
a constant current supply unit configured to supply a constant current to the plurality of A/D conversion units; and
a switch unit configured to selectively connect a vertical output line from the plurality of vertical output lines and the constant current supply unit to an input terminal of an A/D conversion unit of the plurality of A/D conversion units, and
wherein each of the plurality of A/D conversion units includes an integration unit and a comparison unit, wherein the integration unit includes an input capacitor having one terminal connected to the switch unit and the other terminal connected to an inverting input terminal of a differential amplifier, wherein the constant current supply unit is provided for each A/D conversion unit group composed of corresponding ones of the plurality of A/D conversion units, wherein a Bayer color filter is provided for the plurality of pixels included in the pixel array, and wherein the A/D conversion unit group is provided for corresponding ones of the plurality of pixels on which color filters of the same color are individually placed.

7. The apparatus according to claim 6, wherein the integration unit further includes a feedback capacitor disposed between the inverting input terminal and an output terminal of the differential amplifier.

8. The apparatus according to claim 7, wherein the comparison unit is connected to an output terminal of the integration unit via a connection capacitor.

9. A system comprising:
the apparatus according to claim 1;
an optical system configured to form an image onto the pixel array; and
a signal processing unit configured to process a signal output from the apparatus.

* * * * *